United States Patent
Krounbi et al.

(10) Patent No.: US 8,698,259 B2
(45) Date of Patent: Apr. 15, 2014

(54) METHOD AND SYSTEM FOR PROVIDING A MAGNETIC TUNNELING JUNCTION USING THERMALLY ASSISTED SWITCHING

(75) Inventors: Mohamad Towfik Krounbi, San Jose, CA (US); Dmytro Apalkov, San Jose, CA (US); Xueti Tang, Fremont, CA (US); Vladimir Nikitin, Campbell, CA (US)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 44 days.

(21) Appl. No.: 13/332,282

(22) Filed: Dec. 20, 2011

(65) Prior Publication Data

US 2013/0154035 A1    Jun. 20, 2013

(51) Int. Cl.
*H01L 27/22* (2006.01)

(52) U.S. Cl.
USPC ............ 257/421; 257/E27.005; 257/E21.002; 257/E29.323; 427/131; 428/848; 428/826; 428/827; 365/158; 365/173; 365/171; 360/86

(58) Field of Classification Search
USPC ........... 365/171, 173, 158; 257/421; 428/827; 360/86
See application file for complete search history.

(56) References Cited

U.S. PATENT DOCUMENTS

| | | |
|---|---|---|
| 6,185,079 B1 | 2/2001 | Gill |
| 6,980,468 B1 * | 12/2005 | Ounadjela .................... 365/171 |
| 6,985,385 B2 | 1/2006 | Nguyen et al. |
| 6,992,359 B2 | 1/2006 | Nguyen et al. |
| 7,411,817 B2 | 8/2008 | Nozieres et al. |
| 2008/0291721 A1 * | 11/2008 | Apalkov et al. .............. 365/173 |

* cited by examiner

*Primary Examiner* — Jerome Jackson, Jr.
*Assistant Examiner* — Bo Fan
(74) *Attorney, Agent, or Firm* — Convergent Law Group LLP (57) ABSTRACT

A magnetic junction is described. The magnetic junction includes a pinned layer, a nonmagnetic spacer layer, and a free layer. The magnetic junction may also include an additional nonmagnetic spacer layer and an additional pinned layer opposing the nonmagnetic spacer layer and the pinned layer. The nonmagnetic spacer layer is between the pinned layer and the free layer. The free layer is configured to be switchable using a write current passed through the magnetic junction. The free layer is also configured to be thermally stable in a quiescent state and have a reduced thermal stability due to heating from the write current being passed through the magnetic junction. In some aspects, the free layer includes at least one of a pinning layer(s) interleaved with ferromagnetic layer(s), two sets of interleaved ferromagnetic layers having different Curie temperatures, and a ferrimagnet having a saturation magnetization that increases with temperature between ferromagnetic layers.

14 Claims, 6 Drawing Sheets

METHOD AND SYSTEM FOR PROVIDING A MAGNETIC TUNNELING JUNCTION USING THERMALLY ASSISTED SWITCHING

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-RAM). STT-RAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

Figure 1:
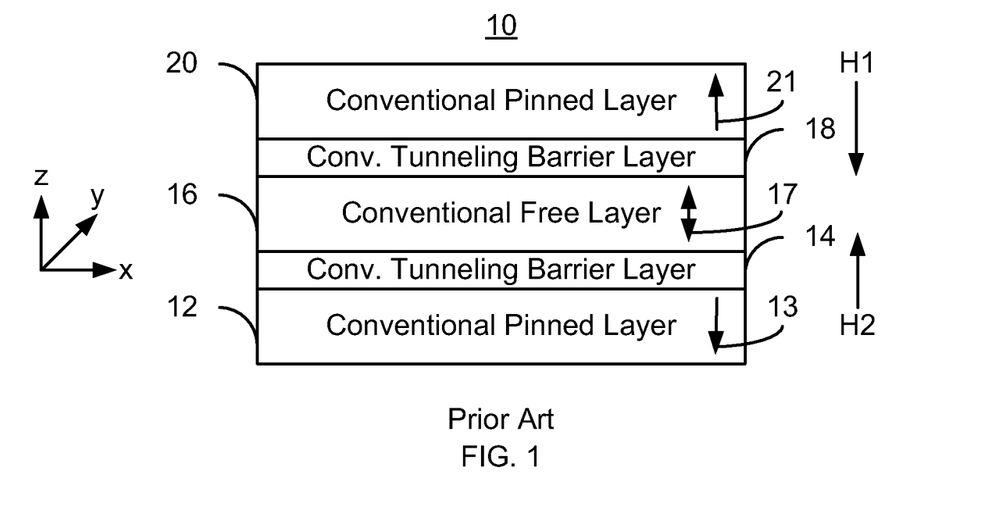
FIG. 1 depicts a conventional magnetic junction.

For example, FIG. 1 depicts a conventional dual magnetic tunneling junction (MTJ) 10 as it may be used in a conventional STT-RAM. The conventional dual MTJ 10 typically includes a first conventional pinned layer 12, a first conventional tunneling barrier layer 14, a conventional free layer 16, a second conventional tunneling barrier 18, and a second conventional pinned layer 20. The conventional tunneling barrier layers 14 and 18 are nonmagnetic and are typically a thin insulator such as MgO.

The conventional pinned layers 12 and 20 and the conventional free layer 16 are magnetic. The magnetic moment 13 of the conventional pinned layer 12 is fixed, or pinned, in a particular direction. The magnetic moment 21 of the conventional pinned layer 20 is fixed, or pinned, in a particular direction, typically substantially opposite to the direction of the magnetic moment 13 of the conventional pinned layer 12. Although depicted as a simple (single) layer, the conventional pinned layers 12 and 20 may include multiple layers. For example, the conventional pinned layer 12 and/or 20 may be a synthetic antiferromagnet (SAF) including magnetic layers antiferromagnetically coupled through thin conductive layers, such as Ru. In such a SAF, multiple magnetic layers interleaved with a thin layer of Ru may be used. Alternatively, the coupling across the Ru layers can be ferromagnetic.

The conventional free layer 16 has a changeable magnetic moment 17. Although depicted as a simple layer, the conventional free layer 16 may also include multiple layers. For example, the conventional free layer 16 may be a synthetic layer including magnetic layers antiferromagnetically or ferromagnetically coupled through thin conductive layers, such as Ru. The pinned layers 12 and 20 and free layer 16 have their magnetic moments 13, 21, and 17, respectively, oriented perpendicular to the plane of the layers. In another devices, the magnetic moments 13, 21, and 17 can be substantially in the plane of the layers.

To switch the magnetic moment 17 of the conventional free layer 16, a current is driven perpendicular to plane (in the z-direction). When a sufficient current is driven from the conventional pinned layer 12 toward the pinned layer 20, the magnetic moment 17 of the conventional free layer 16 may switch to be parallel to the magnetic moment 21 of the conventional pinned layer 20. When a sufficient current is driven from the conventional pinned layer 20 toward the conventional pinned layer 12, the magnetic moment 17 of the free layer 16 may switch to be parallel to that of the pinned layer 12. The differences in magnetic configurations correspond to different magnetoresistance levels and thus different logical states (e.g. a logical "0" and a logical "1") of the conventional MTJ 10.

Although the conventional MTJ 10 may be written using spin transfer and used in an STT-RAM, there are drawbacks. The conventional dual MTJ 10 is desired to be thermally stable. As such, $\Delta$ for the free layer 16, the thermal stability coefficient, may be desired to be high. However, a low switching current for spin transfer-based switching is also desired. In the macrospin approximation, the switching current is proportional to $(\alpha/\eta)\Delta$, where $\alpha$ is the magnetic damping coefficient, $\eta$ is the spin torque efficiency, and $\Delta$ is the thermal stability coefficient described above. The switching current thus tends to increase with increases in the thermal stability coefficient. Stated differently, as the magnetic junction 10 becomes more thermally stable, the switching current increases.

Accordingly, what is needed is a method and system for improving the thermal stability of the magnetic junction without substantially increasing the switching current. The method and system described herein address such a need.

BRIEF SUMMARY OF THE INVENTION

A magnetic junction is described. The magnetic junction includes a pinned layer, a nonmagnetic spacer layer, and a free layer. The magnetic junction may also include an additional nonmagnetic spacer layer and an additional pinned layer opposing the nonmagnetic spacer layer and the pinned layer. The nonmagnetic spacer layer is between the pinned layer and the free layer. The free layer is configured to be switchable using a write current passed through the magnetic junction. The free layer is also configured to be thermally stable in a quiescent state and have a reduced thermal stability due to heating from the write current being passed through the magnetic junction. In some aspects, the free layer includes at least one of a pinning layer(s) interleaved with ferromagnetic layer(s), two sets of interleaved ferromagnetic layers having different Curie temperatures, and a ferrimagnet having a saturation magnetization that increases with temperature between ferromagnetic layers.

DETAILED DESCRIPTION OF THE INVENTION

The exemplary embodiments relate to magnetic junctions usable in magnetic devices, such as magnetic memories, and the devices using such magnetic junctions. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

The exemplary embodiments describe methods and systems for providing a magnetic junction as well as a magnetic memory utilizing the magnetic junction. The magnetic junction includes a pinned layer, a nonmagnetic spacer layer, and a free layer. The magnetic junction may also include an additional nonmagnetic spacer layer and an additional pinned layer opposing the nonmagnetic spacer layer and the pinned layer. The nonmagnetic spacer layer is between the pinned layer and the free layer. The free layer is configured to be switchable using a write current passed through the magnetic junction. The free layer is also configured to be thermally stable in a quiescent state and have a reduced thermal stability due to heating from the write current being passed through the magnetic junction. In some aspects, the free layer includes at least one of a pinning layer(s) interleaved with ferromagnetic layer(s), two sets of interleaved ferromagnetic layers having different Curie temperatures, and a ferrimagnet having a saturation magnetization that increases with temperature between ferromagnetic layers.

The exemplary embodiments are described in the context of particular magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomenon. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic junctions and substructures. However, one of ordinary skill in the art will readily recognize that the method and system are consistent with the use of magnetic memories having multiple magnetic junctions and using multiple substructures. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

Figure 2:
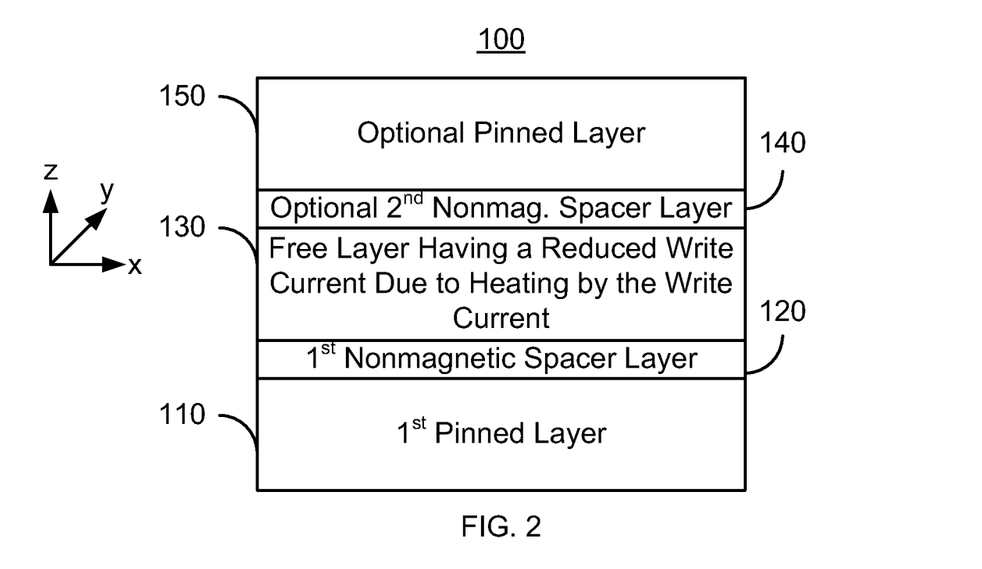
FIG. 2 depicts an exemplary embodiment of a magnetic junction using thermally assisted switching.

FIG. 2 depicts an exemplary embodiment of a magnetic junction 100 usable in a magnetic memory, such as an STT-RAM. For clarity, FIG. 2 is not to scale. The magnetic junction 100 includes a first pinned layer 110, a first nonmagnetic spacer layer 120, a free layer 130, a second nonmagnetic spacer layer 140, and a second pinned layer 150. The pinned layers 110 and 150 are ferromagnetic and thus may include one or more of Fe, Ni, and Co. Further, the magnetic moments of the pinned layer 110 and 150 are generally desired to be fixed in place during reading of and writing to the free layer 130. In some embodiments, the magnetic moments of the pinned layer 110 and 150 are desired to be antiparallel during programming of the free layer 130. The pinned layer 110 and 150 are depicted as single layers. However, in other embodiments, the pinned layer 110 and/or 150 may be a multilayer including, but not limited to a SAF ferromagnetic layers separated by a nonmagnetic layer that may be Ru. Although magnetic moments are not shown, the magnetic moments of the layers 110, 130, and 150 may be in plane in some embodiments. In other embodiments, the magnetic moments are perpendicular to plane. Thus, each of the layers 110, 130, and 150 may have a perpendicular anisotropy field that exceeds its out-of-plane demagnetization field ($4\pi M_s$). Further, although depicted as a dual junction including multiple pinned layers 110 and 150 and multiple nonmagnetic spacer layers 120 and 140, in some embodiments, the magnetic junction 100 may be a single magnetic junction including one pinned layer, one nonmagnetic spacer layer, and one free layer.

Each of the spacer layers 120 and 140 is nonmagnetic. In some embodiments, each spacer layer 120 and/or 140 is an insulator, for example a tunneling barrier. In such embodiments, each spacer layer 120 and/or 140 may include crystalline MgO, which may enhance the TMR and spin transfer efficiency of the magnetic junction. In other embodiments, each spacer layer 120 and/or 140 may be a conductor, such as Cu. In alternate embodiments, each spacer layer 120 and/or 140 might have another structure, for example a granular layer including conductive channels in an insulating matrix. Finally, in other embodiments, the spacer layers 120 may differ in structure. For example, one spacer layers 120 and/or 140 might be conductive while the other is insulating. Such spacer layers 120 and 140 may thus alternate in conductivity or have some other relationship.

The free layer 130 is magnetic and thus includes at least one of Co, Ni, and Fe. The free layer 130 is configured to be switchable between stable magnetic states when a write current is passed through the magnetic junction 100. The free layer 130 is also depicted as a single layer but may include multiple layers. For example, the free layer 130 might also be a SAF. In other embodiments, other multilayers may be used for the free layer 130 and/or the pinned layer 110.

Further, the free layer 130 is configured to be thermally stable in a quiescent state and have a reduced thermal stability due to heating from the write current being passed through the magnetic junction. The thermal stability is due at least in part to magnetic interactions between components in the free layer 130. The thermal stability is reduced at higher temperatures because the interaction is reduced or changed at higher temperatures. For example, in some embodiments, the free layer 130 may include an internal pinning layer, such as an antiferromagnet (AFM). In such embodiments, the AFM layer pins the remaining ferromagnetic layers in the free layer 130 using an exchange bias. An increase in temperature brings the AFM layer closer to the blocking temperature and reduces the exchange interaction. Thus, the ability of the AFM layer to pin the moments of the free layer is inhibited. Consequently, thermal stability of the free layer is reduced. In other embodiments, the free layer 130 may include multiple sets of interleaved magnetic layers that have different Curie temperatures and are exchange coupled. As the free layer 130 nears the lower Curie temperature, the exchange interaction is diminished and the thermal stability reduced. In other embodiments, the free layer 130 may include a ferrimagnet in which the sublattices have different Curie temperatures. As the temperature increases, one of the sublattices may have its magnetic moment decrease more rapidly than the other sublattices. As a result, the magnetic moment of the ferrimagnet increases. This increase in magnetic moment corresponds to an increase of demagnetization field, which causes reduction in the effective magnetic anisotropy. The reduction in magnetic anisotropy translates to a decrease in the thermal stability. Other mechanisms for reducing the thermal stability of the free layer as temperature increases may be used. For example, to increase the temperature rise during current application, thermal barriers may be employed. Thermal barriers are layer with materials having very low thermal conductivity (typically lower than 0.5 W/(cm*K)) on top and bottom of the structure (not shown on the drawings). Example of such thermal barriers may include any of the materials such as Bi, Gd, Tb, Nd, Ti, Zr, Hf or any combination of these materials. In some embodiments, the thickness of the thermal barriers can be 1-20 nm.

Thus, the magnetic junction 100 may be usable in applications using spin transfer torque. For example, the magnetic junction 100 may be part of a memory including magnetic junctions 100. In addition, the magnetic junction 100 may be thermally stable, but programmed at a lower write current. In particular, a write current driven through the magnetic junction 100 heats the magnetic junction 100. As a result, the components of the free layer 130 may be changed, reducing the thermal stability of the free layer 130. In particular, Δ of the free layer 130 may be lessened. This reduction in Δ results in a reduced write current for the free layer 130. Thus, the free layer 130 may have improved thermal stability in a quiescent state (e.g. when the free layer 130 is not being programmed) as well as a reduced thermal stability (and reduced write current) when being written. Consequently, performance of the magnetic junction 100 and a memory using the magnetic junction 100 may be improved.

Figure 3:
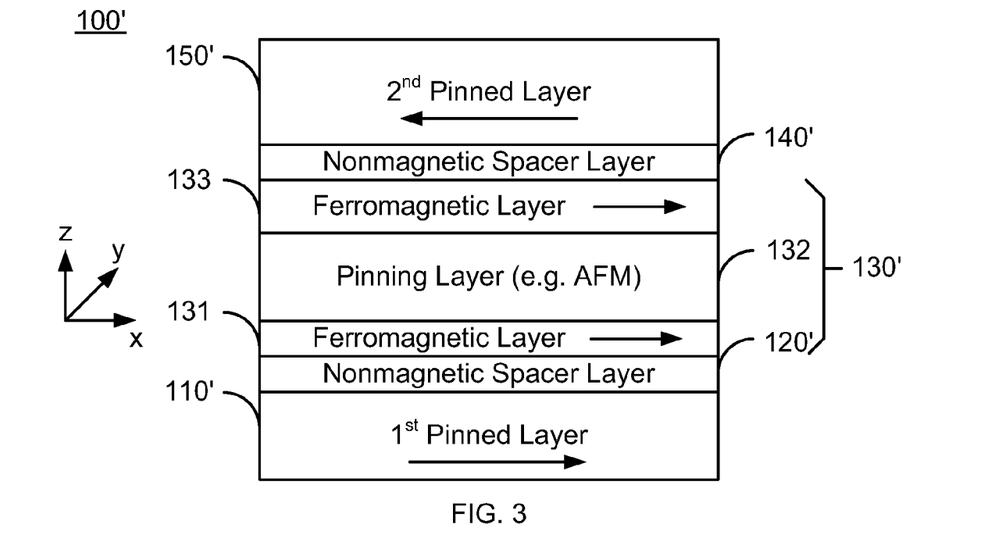
FIG. 3 depicts an exemplary embodiment of another magnetic junction using thermally assisted switching.

FIG. 3 depicts an exemplary embodiment of a magnetic junction 100' usable in a magnetic memory, such as an STT-RAM. For clarity, FIG. 3 is not to scale. The magnetic junction 100' is analogous to the magnetic junction 100. Consequently, similar components have analogous labels. The magnetic junction 100' thus includes a pinned layer 110', a nonmagnetic spacer layer 120', a free layer 130', another nonmagnetic spacer layer 140', and a pinned layer 150' that are analogous to the pinned layer 110, the first nonmagnetic spacer layer 120, the free layer 130, the second nonmagnetic spacer layer 140, and the second pinned layer 150, respectively. Thus, the structure and function of these components 110', 120', 130', 140', and 150' is analogous to that described above for the components 110, 120, 130, 140, and 150. Further, although depicted as a dual magnetic junction 100' one of the pinned layers 110' or 150' and one of the spacer layers 130' or 140', respectively, may be omitted such that the magnetic junction 100' may be a single magnetic junction.

The pinned layers 110' and 150' are ferromagnetic and thus may include one or more of Fe, Ni, and Co. Further, the magnetic moments of the pinned layer 110' and 150' are generally desired to be fixed in place during reading of and writing to the free layer 130'. In the embodiment shown, the magnetic moments of the pinned layers 110' and 150' are antiparallel. The pinned layer 110' and 150' are depicted as single layers. However, in other embodiments, the pinned layer 110' and/or 150' may be a multilayer including, but not limited to a SAF ferromagnetic layers separated by a nonmagnetic layer that may be Ru. The magnetic moments of the layers 110', 130', and 150' are in-plane in the embodiment shown, but may be out-of-plane in other embodiments.

Each of the spacer layers 120' and 140' is nonmagnetic. In some embodiments, each spacer layer 120' and/or 140' is an insulator, for example a tunneling barrier. In such embodiments, each spacer layer 120' and/or 140' may include crystalline MgO, which may enhance the TMR of the magnetic junction. In other embodiments, each spacer layer 120' and/or 140' may be a conductor, such as Cu. In alternate embodiments, each spacer layer 120' and/or 140' might have another structure, for example a granular layer including conductive channels in an insulating matrix. Finally, in other embodiments, the spacer layers 120' may differ in structure. For example, one spacer layers 120' and/or 140' might be conductive while the other is insulating.

The free layer 130' is magnetic and thus includes at least one of Co, Ni, and Fe. The free layer 130' is configured to be switchable between a plurality of stable magnetic states when a write current is passed through the magnetic junction 100'. Further, the free layer 130' is configured to be thermally stable in a quiescent state and have a reduced thermal stability due to heating from the write current being passed through the magnetic junction.

The thermal stability is due at least in part to magnetic interactions between components in the free layer 130'. The thermal stability is reduced at higher temperatures because the interaction is reduced or changed at higher temperatures. In particular, the free layer 130' includes ferromagnetic layers 131 and 133 interleaved with a pinning layer 132. In other embodiments, additional ferromagnetic layers 131 and 133 and additional pinning layers 132 may be provided. However, the outer layers of the free layer 130' adjoining the nonmagnetic spacer layers 120' and 140' are desired to be ferromagnetic layers rather than pinning layers. In some embodiments, the pinning layer 132 is an AFM, such as IrMn, PtMn and/or FeRh. Note that the ferromagnetic layers 131 and 133 are shown as having substantially the same thickness. However, in other embodiments, the ferromagnetic layers 131 and 133 may have different thicknesses.

The ferromagnetic layers 131 and 133 are magnetically coupled with the pinning layer 132. More specifically, the ferromagnetic layers 131 and 133 are exchange coupled with the pinning layer 132. Each pinning layer 132 is, therefore, desired to be sufficiently thick that the pinning layer 132 can support an exchange interaction. In some embodiments, therefore, the pinning layer 132 is at least one nanometer thick. In some such embodiments, the pinning layer 132 is at least fifty nanometers thick. The thickness of the pinning layer 132 depends upon the pinning strength of the material(s) used for the pinning layer 132.

When the magnetic junction 100' is in a quiescent state, no current is driven through the magnetic junction 100'. In this state, the exchange bias between the pinning layer 132 and the ferromagnetic layers 131 and 133 stabilizes the magnetic moments of the ferromagnetic layer 131 and 133. Thus, the magnetic moments of the free layer 130' are locked in place. In the state shown, the magnetic moments of the layers 131 and 133 are in the positive x direction. In the absence of a write current, the magnetic moments of the layers 131 and 133 are thermally stable.

If the magnetic junction 100' is desired to be programmed, a write current is driven through the magnetic junction 100' in a current-perpendicular-to-plane (CPP) direction. In the embodiment shown, the write current may be driven in the plus z direction to switch the magnetic moments of the free layer 130' to minus x direction. The write current passing through the magnetic junction 100' heats the magnetic junction 100'. This heating may raise the temperature of the magnetic junction 100' such that the pinning layer 132 is close to its blocking temperature. As the pinning layer 132 approaches its blocking temperature, the pinning layer 132 becomes more disordered. Thus, the pinning layer 132 is no longer able to stabilize the magnetic moments of the ferromagnetic layers 131 and 133. Stated differently, the exchange coupling between the pinning layer 132 and the ferromagnetic layers 131 and 133 is reduced or lost. Therefore, A of the free layer 130' may be lessened at higher temperatures. The ferromagnetic layers 131 and 133 become easier to switch. Stated differently, the thermal stability of the free layer 130' is reduced. The magnetic moments of the ferromagnetic layers 131 and 133 may be more easily switched. Thus, the ferromagnetic layers 131 and 133 may be switched at a lower write current. Once the direction of magnetization of the ferromagnetic layers 131 and 133 has been switched, the write current may be gradually reduced. For example, in some embodiments, the write current pulse has a fall time of at least one through ten nanoseconds. This allows the magnetizations of the ferromagnetic layers an opportunity to be locked into the desired state.

Thus, the magnetic junction 100' may be usable in applications using spin transfer torque. In addition, the magnetic junction 100' may be thermally stable, but programmed at a lower write current. Thus, the free layer 130' may have improved thermal stability in a quiescent state as well as a reduced thermal stability (and reduced write current) when being written. Consequently, performance of the magnetic junction 100' and a memory using the magnetic junction 100' may be improved.

Figure 4:
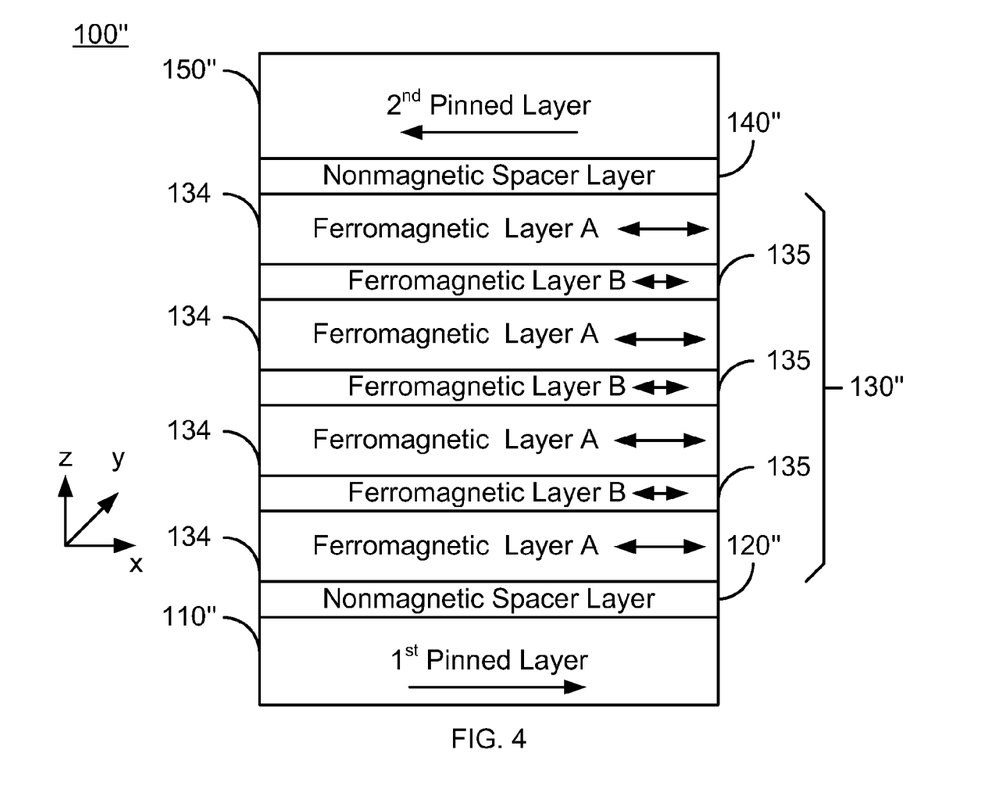
FIG. 4 depicts an exemplary embodiment of another magnetic junction using thermally assisted switching.

FIG. 4 depicts an exemplary embodiment of a magnetic junction 100" usable in a magnetic memory, such as an STT-RAM. For clarity, FIG. 4 is not to scale. The magnetic junction 100" is analogous to the magnetic junction 100. Consequently, similar components have analogous labels. The magnetic junction 100" thus includes a pinned layer 110", a nonmagnetic spacer layer 120", a free layer 130", another nonmagnetic spacer layer 140", and a pinned layer 150" that are analogous to the pinned layer 110, the first nonmagnetic spacer layer 120, the free layer 130, the second nonmagnetic spacer layer 140, and the second pinned layer 150, respectively. Thus, the structure and function of these components 110", 120", 130", 140", and 150" is analogous to that described above for the components 110, 120, 130, 140, and 150. Further, although depicted as a dual magnetic junction 100" one of the pinned layers 110" or 150" and one of the spacer layers 130" or 140", respectively, may be omitted such that the magnetic junction 100" may be a single magnetic junction.

The pinned layers 110" and 150" are ferromagnetic and thus may include one or more of Fe, Ni, and Co. Further, the magnetic moments of the pinned layer 110" and 150" are generally desired to be fixed in place during reading of and writing to the free layer 130". In the embodiment shown, the magnetic moments of the pinned layers 110" and 150" are antiparallel. The pinned layer 110" and 150" are depicted as single layers. However, in other embodiments, the pinned layer 110" and/or 150" may be a multilayer including, but not limited to a SAF ferromagnetic layers separated by a nonmagnetic layer that may be Ru. The magnetic moments of the layers 110", 130", and 150" are shown as in-plane.

Each of the spacer layers 120" and 140" is nonmagnetic. In some embodiments, each spacer layer 120" and/or 140" is an insulator, for example a tunneling barrier. In such embodiments, each spacer layer 120" and/or 140" may include crystalline MgO, which may enhance the TMR of the magnetic junction. In other embodiments, each spacer layer 120" and/or 140" may be a conductor, such as Cu. In alternate embodiments, each spacer layer 120" and/or 140" might have another structure, for example a granular layer including conductive channels in an insulating matrix. Finally, in other embodiments, the spacer layers 120" may differ in structure. For example, on spacer layers 120" and/or 140" might be conductive while the other is insulating.

The free layer 130" is magnetic and thus includes at least one of Co, Ni, and Fe. The free layer 130" is configured to be switchable between stable magnetic states when a write current is passed through the magnetic junction 100". Further, the free layer 130" is configured to be thermally stable in a quiescent state and have a reduced thermal stability due to heating from the write current being passed through the magnetic junction.

The thermal stability is due at least in part to magnetic interactions between components in the free layer 130". The thermal stability is reduced at higher temperatures because the interaction is reduced or changed at higher temperatures. In particular, the free layer 130" includes two sets of ferromagnetic layers. The free layer includes ferromagnetic layers A 134 and ferromagnetic layers B 135. The ferromagnetic layers A 134 and ferromagnetic layers B 135 are interleaved. The ferromagnetic layers A 134 and ferromagnetic layers B 135 also have different Cure temperatures. The ferromagnetic layers A 134 have a higher Curie temperature than the ferromagnetic layers B 135. For example, in some embodiments, the ferromagnetic layers A 134 have a Curie temperature of at least six hundred degrees centigrade and not more than one thousand two hundred degrees centigrade. In some embodiments, the ferromagnetic layers B 135 have a Curie temperature of at least one hundred fifty degrees centigrade and not more than five hundred degrees centigrade. In the embodiment shown, the ferromagnetic layers A 134 are thicker than the ferromagnetic layers B 135. In other embodiments, the thicknesses may differ. In addition, the thickness of each of the ferromagnetic layers A 134 is the same. Similarly, the thickness of each of the ferromagnetic layers B 135 is the same. However, in other embodiments, the thicknesses may differ. For example, there may be a gradient in thickness from the top of the magnetic junction 100" to the bottom.

The ferromagnetic layers A 134 and the ferromagnetic layers B 135 are exchange coupled. Thus, the ferromagnetic layers A 134 and the ferromagnetic layers B 135 are also ferromagnetically aligned. Thus, the ferromagnetic layers A 134 are coupled through the ferromagnetic layers B 135 and vice versa. In the embodiment shown, the magnetic moments of the ferromagnetic layers A 134 and the ferromagnetic layers B 135 are in plane. Thus, the magnetic junction 100" may have a sufficient anisotropy to ensure that the easy axes of the ferromagnetic layers A 134 and the ferromagnetic layers B 135 are in the desired direction. For example, in some embodiments, the ferromagnetic layers A 134 and ferromagnetic layers B 135 may have an aspect ratio in the x-y plane (x length divided by y length) of at least two. In another embodiment, the pinning layer 132 of the magnetic junction 100' may be used in connection with the magnetic junction 100". The ferromagnetic layers 134 and 135 include one or more of Fe, Co, and Ni. The ferromagnetic layers 134 and 135 may also include, but are not limited to, one or more of B, Ta, Pd, Pt, Cs, Zr, Tb, Hf and Ru.

When the magnetic junction 100" is in a quiescent state, no current is driven through the magnetic junction 100". In this state, the exchange interaction between the ferromagnetic layers A 134 and ferromagnetic layers B 135 stabilizes the magnetic moments of the ferromagnetic layers A 134 and ferromagnetic layers B 135. The free layer 130 thus behaves as a single layer having enhanced stability. Thus, the magnetic moments of the free layer 130" are locked in place in the positive x direction or in the negative x direction. In the absence of a write current, the magnetic moments of the ferromagnetic layers A 134 and ferromagnetic layers B 135 are thermally stable.

If the magnetic junction 100" is desired to be programmed, a write current is driven through the magnetic junction 100" in a CPP direction. In the embodiment shown, the write current may be driven in the plus or minus z direction to switch the magnetic moments of the free layer 130". The write current passing through the magnetic junction 100" heats the magnetic junction 100". This heating may raise the temperature of the magnetic junction 100" so that the ferromagnetic layers B 135 are close to their Curie temperature. As the ferromagnetic layers B 135 (having the lower Curie temperature) approach their Curie temperature, the ferromagnetic layers B 135 become more disordered. Thus, ferromagnetic coupling between the ferromagnetic layers B 135 and the ferromagnetic layers A 134 is reduced or lost. Therefore, A of the free layer 130" may be lessened at higher temperatures. The ferromagnetic layers A 134 and/or the ferromagnetic layers B 135 become easier to switch. Stated differently, the thermal stability of the free layer 130" is reduced. The magnetic moments of the ferromagnetic layers 134 and 135 may be switched at a lower write current. Once the direction of magnetization of the ferromagnetic layers 134 and 135 has been switched, the write current may be gradually reduced. For example, in some embodiments, the write current pulse has a fall time of at least one through ten nanoseconds. Further, a gradient in the thicknesses of the magnetic layers may aid in the free layer 130" switching in a reliable manner, generally starting at the top or bottom of the ferromagnetic layers 134 and 135. This allows the magnetizations of the ferromagnetic layers an opportunity to be locked into the desired state.

Thus, the magnetic junction 100" may be usable in applications using spin transfer torque. In addition, the magnetic junction 100" may be thermally stable, but programmed at a lower write current. Thus, the free layer 130" may have improved thermal stability in a quiescent state as well as a reduced thermal stability (and reduced write current) when being written. Consequently, performance of the magnetic junction 100" and a memory using the magnetic junction 100" may be improved.

Figure 5:
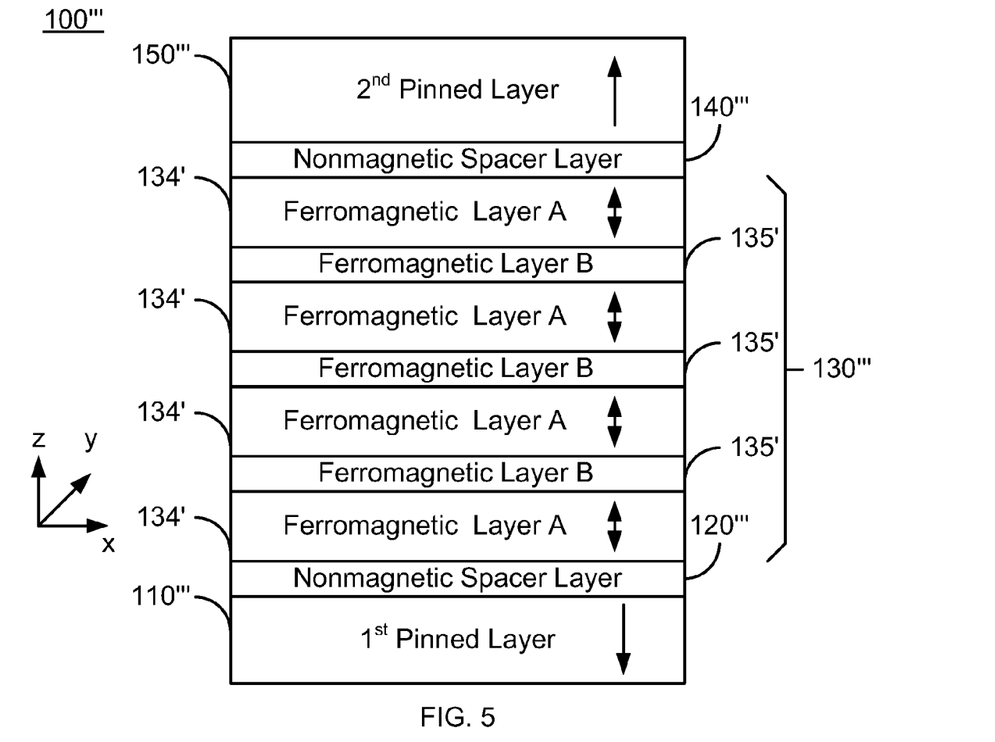
FIG. 5 depicts an exemplary embodiment of another magnetic junction using thermally assisted switching.

FIG. 5 depicts an exemplary embodiment of a magnetic junction 100''' usable in a magnetic memory, such as an STT-RAM. For clarity, FIG. 5 is not to scale. The magnetic junction 100''' is analogous to the magnetic junctions 100 and 100". Consequently, similar components have analogous labels. The magnetic junction 100''' thus includes a pinned layer 110''', a nonmagnetic spacer layer 120''', a free layer 130''', another nonmagnetic spacer layer 140''', and a pinned layer 150''' that are analogous to the pinned layer 110/110", the first nonmagnetic spacer layer 120/120", the free layer 130/130", the second nonmagnetic spacer layer 140/140", and the second pinned layer 150/150", respectively. Thus, the structure and function of these components 110''', 120''', 130''', 140''', and 150''' is analogous to that described above for the components 110, 120, 130, 140, and 150. Further, although depicted as a dual magnetic junction 100" one of the pinned layers 110" or 150" and one of the spacer layers 130" or 140", respectively, may be omitted such that the magnetic junction 100" may be a single magnetic junction.

The magnetic junction 100''' differs from the magnetic junction 100" in that the magnetic moments of the ferromagnetic layers A 134' and the magnetic moments of the ferromagnetic layers 135' are perpendicular to plane. As such, a particular aspect ratio of the MTJ pillar (e.g. the layers of the junction 100''') in x-y plane may not be needed. When the magnetic junction 100''' is in a quiescent state, no current is driven through the magnetic junction 100'''. In this state, the exchange interaction between the ferromagnetic layers A 134' and ferromagnetic layers B 135' stabilizes the magnetic moments of the ferromagnetic layers A 134 and ferromagnetic layers B 135. Thus, the magnetic moments of the free layer 130''' are locked in place in the positive z direction or in the negative z direction. In the absence of a write current, the magnetic moments of the ferromagnetic layers A 134' and ferromagnetic layers B 135' are thermally stable. The ferromagnetic layers 134' and 135' include one or more of Fe, Co, and Ni. The ferromagnetic layers 134' and 135' may also include, but are not limited to, one or more of B, Ta, Pd, Pt, Cs, Zr, Tb, Hf and Ru.

If the magnetic junction 100''' is desired to be programmed, a write current is driven through the magnetic junction 100''' in a CPP direction. The magnetic junction 100''' is programmed in an analogous manner to the magnetic junction 100". As the ferromagnetic layers B 135' (having the lower Curie temperature) approach their Curie temperature, the ferromagnetic layers B 135' become more disordered. Thus, ferromagnetic coupling between the ferromagnetic layers B 135' and the ferromagnetic layers A 134' is reduced or lost. Therefore, A of the free layer 130''' may be lessened at higher temperatures. The ferromagnetic layers A 134' and/or the ferromagnetic layers B 135' become easier to switch. Stated differently, the thermal stability of the free layer 130''' is reduced. The magnetic moments of the ferromagnetic layers 134' and 135' may be switched at a lower write current. Once the direction of magnetization of the ferromagnetic layers 134' and 135' has been switched, the write current may be gradually reduced. For example, in some embodiments, the write current pulse has a fall time of at least one through ten nanoseconds. This allows the magnetizations of the ferromagnetic layers an opportunity to be locked into the desired state.

Thus, the magnetic junction 100''' may be usable in applications using spin transfer torque. In addition, the magnetic junction 100''' may be thermally stable, but programmed at a lower write current. Thus, the free layer 130''' may have improved thermal stability in a quiescent state as well as a reduced thermal stability (and reduced write current) when being written. Consequently, performance of the magnetic junction 100''' and a memory using the magnetic junction 100'' may be improved.

Figure 6:
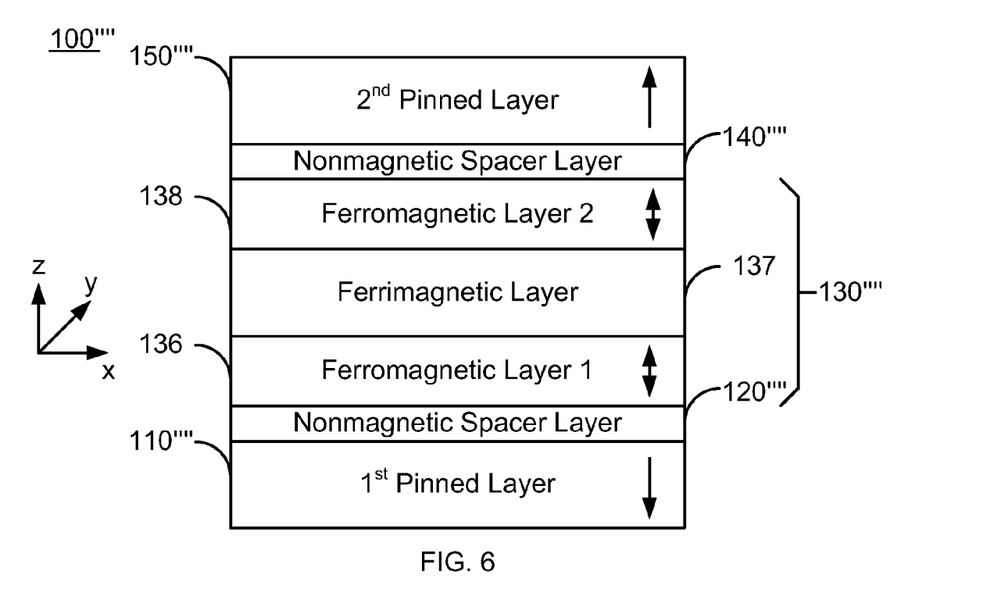
FIG. 6 depicts an exemplary embodiment of another magnetic junction using thermally assisted switching.

FIG. 6 depicts an exemplary embodiment of a magnetic junction 100'''' usable in a magnetic memory, such as an STT-RAM. For clarity, FIG. 6 is not to scale. The magnetic junction 100'''' is analogous to the magnetic junction 100. Consequently, similar components have analogous labels. The magnetic junction 100'''' thus includes a pinned layer 110'''', a nonmagnetic spacer layer 120'''', a free layer 130'''', another nonmagnetic spacer layer 140'''', and a pinned layer 150'''' that are analogous to the pinned layer 110, the first nonmagnetic spacer layer 120, the free layer 130, the second nonmagnetic spacer layer 140, and the second pinned layer 150, respectively. Thus, the structure and function of these components 110'''', 120'''', 130'''', 140'''', and 150'''' is analogous to that described above for the components 110, 120, 130, 140, and 150. Further, although depicted as a dual magnetic junction 100'''' one of the pinned layers 110'''' or 150'''' and one of the spacer layers 130'''' or 140'''', respectively, may be omitted such that the magnetic junction 100'''' may be a single magnetic junction.

The pinned layers 110'''' and 150'''' are ferromagnetic and thus may include one or more of Fe, Ni, and Co. Further, the magnetic moments of the pinned layer 110'''' and 150'''' are generally desired to be fixed in place during reading of and writing to the free layer 130''''. In the embodiment shown, the magnetic moments of the pinned layers 110'''' and 150'''' are antiparallel. The pinned layer 110'''' and 150'''' are depicted as single layers. However, in other embodiments, the pinned layer 110'''' and/or 150'''' may be a multilayer including, but not limited to a SAF ferromagnetic layers separated by a nonmagnetic layer that may be Ru. The magnetic moments of the layers 110'''', 130'''', and 150'''' are shown as perpendicular-to-plane.

Each of the spacer layers 120'''' and 140'''' is nonmagnetic. In some embodiments, each spacer layer 120'''' and/or 140'''' is an insulator, for example a tunneling barrier. In such embodiments, each spacer layer 120'''' and/or 140'''' may include crystalline MgO, which may enhance the TMR of the magnetic junction. In other embodiments, each spacer layer 120'''' and/or 140'''' may be a conductor, such as Cu. In alternate embodiments, each spacer layer 120'''' and/or 140'''' might have another structure, for example a granular layer including conductive channels in an insulating matrix. Finally, in other embodiments, the spacer layers 120'''' may differ in structure. For example, one spacer layers 120'''' and/or 140'''' might be conductive while the other is insulating.

The free layer 130'''' is magnetic and thus includes at least one of Co, Ni, and Fe. The free layer 130'''' is configured to be switchable between a plurality of stable magnetic states when a write current is passed through the magnetic junction 100''''. Further, the free layer 130'''' is configured to be thermally stable in a quiescent state and have a reduced thermal stability due to heating from the write current being passed through the magnetic junction.

The thermal stability is due at least in part to magnetic interactions between components in the free layer 130'''' and is reduced by magnetostatic demagnetization field. Thus, if the demagnetization field is increased, thermal stability is reduced. When the anisotropy field becomes equal to demagnetization field, the effective thermal stability is close to zero. In particular, the free layer 130'''' includes ferromagnetic layers 136 and 138 separated by a ferrimagnetic layer 137. In the embodiment shown, a single ferrimagnetic layer 137 sandwiched by two ferromagnetic layers 136 and 138 are used. However, another number of ferrimagnetic layers (not shown) interleaved with ferromagnetic layers (not shown) may be used. In at least some such embodiments, ferromagnetic layers are desired to adjoin the nonmagnetic spacer layers 120'''' and 140''''.

More specifically, the ferromagnetic layers 136 and 138 may be a partial or high perpendicular magnetic anisotropy layers. Thus, the magnetic moments of the layers 136 137, and 138 may be perpendicular to plane, as shown in FIG. 6. The ferromagnetic layers 136 and 138 might also be used to increase the magnetoresistance of the magnetic junction 100. For example, the ferromagnetic layers 136 and 138 may include CoFeB. The ferromagnetic layers 136 and 138 include one or more of Fe, Co, and Ni. The ferromagnetic layers 136 and 138 may also include, but are not limited to, one or more of B, Ta, Pd, Pt, Cs, Zr, Tb, Hf and Ru.

The ferrimagnet 137 has a property that the saturation magnetization increases with increasing temperature and, therefore, the effective magnetic anisotropy decreases with increasing temperature. Thus, although termed a ferrimagnet, another material with this property may be substituted for the ferrimagnet 137. The ferrimagnet 137 includes two sublattices having opposite magnetization directions. In addition, the Curie temperatures of the sublattices differ. More specifically, the sublattice having the lower saturation magnetization may have the lower Curie temperature. Even if the higher saturation magnetization sublattice has the lower Curie temperature, there is a range of temperatures in which the saturation magnetization increases with increasing temperature. Consequently, the saturation magnetization of the ferrimagnet 137 may increase with increasing temperature at least until the lowest Curie temperature is reached. An example of the ferrimagnetic materials include oxides of Fe, Co, Ni, Zn, Mn of various compositions, Co, Fe, Ni alloy with rare earth elements like Gd, Tb, Dy, Ho.

When the magnetic junction 100'''' is in a quiescent state, no current is driven through the magnetic junction 100''''. Consequently, there is no heating and no attendant increase of the demagnetization field. The magnetic moments of the free layer 130'''' are thus locked in place. Because of the presence of the ferromagnetic layers 136 and 138 and the attendant surface anisotropy, the magnetic moments are perpendicular to plane. In the absence of a write current, the free layer 130'''' is thermally stable.

If the magnetic junction 100'''' is desired to be programmed, a write current is driven through the magnetic junction 100'''' in a CPP direction. In the embodiment shown, the write current may be driven in the plus or minus z direction to switch the magnetic moments of the free layer 130''''.

The write current passing through the magnetic junction 100'''' heats the magnetic junction 100'''', raising the temperature of the magnetic junction 100''''. As the temperature of the magnetic junction 100'''', and thus the free layer 130'''', rises, the saturation magnetization of the ferrimagnet 137 increases. As discussed above, this increase is due to the differences in Curie temperature of the sublattices of the ferrimagnet 137. As the saturation magnetization of the ferrimagnet 137 increases, the demagnetization field increases and the anisotropy field decreases. In some embodiments, the anisotropy field may go to zero. Therefore, Δ of the free layer 130'''' may be reduced at higher temperatures. The free layer 130'''' becomes easier to switch. Stated differently, the thermal stability of the free layer 130'''' is diminished. The magnetic moments of the ferromagnetic layers 136 and 138 may be switched at a lower write current. Once the direction of magnetization of the free layer 130'''' has been switched, the write current may be gradually reduced. For example, in some embodiments, the write current pulse has a fall time of at least one through ten nanoseconds. This allows the magnetizations of the ferromagnetic layers an opportunity to be locked into the desired state.

Thus, the magnetic junction 100'''' may be usable in applications using spin transfer torque. In addition, the magnetic junction 100'''' may be thermally stable, but programmed at a lower write current. Thus, the free layer 130'''' may have improved thermal stability in a quiescent state as well as a reduced thermal stability (and reduced write current) when being written. Consequently, performance of the magnetic junction 100'''' and a memory using the magnetic junction 100'''' may be improved.

Figure 7:
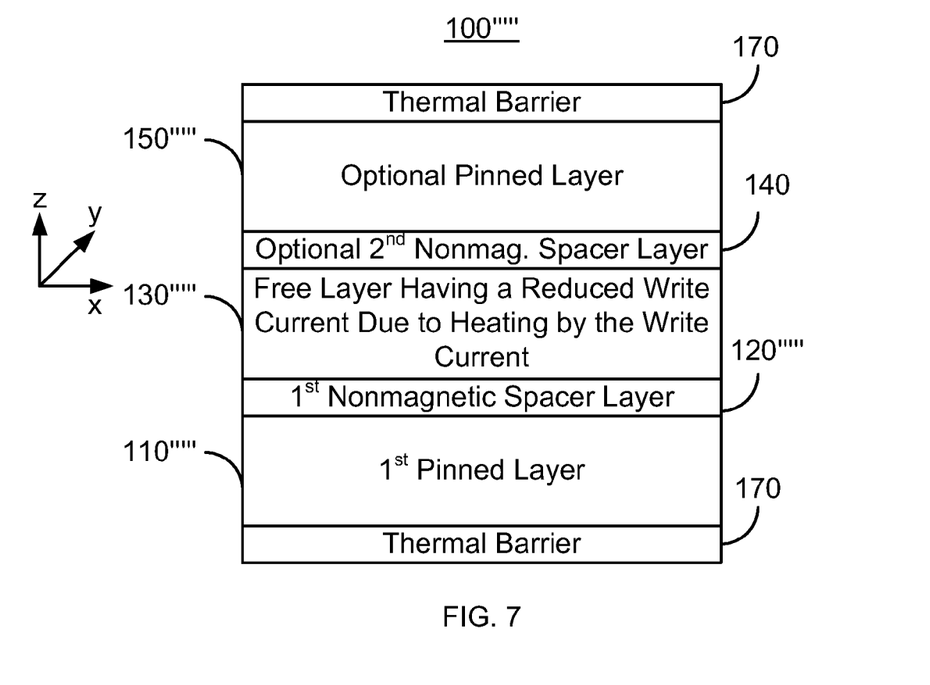
FIG. 7 depicts an exemplary embodiment of another magnetic junction using thermally assisted switching.

FIG. 7 depicts an exemplary embodiment of a magnetic junction 100''''' usable in a magnetic memory, such as an STT-RAM. For clarity, FIG. 7 is not to scale. The magnetic junction 100''''' is analogous to the magnetic junctions 100, 100', 100'', 100''', and/or 100''''. Consequently, similar components have analogous labels. The magnetic junction 100''''' thus includes a pinned layer 110''''', a nonmagnetic spacer layer 120''''', a free layer 130''''', another nonmagnetic spacer layer 140''''', and a pinned layer 150''''' that are analogous to the pinned layers 110/110'/110''/110'''/110'''', the first nonmagnetic spacer layer 120/120'/120''/120'''/120'''', the free layer 130/130'/130''/130'''/130'''', the second nonmagnetic spacer layer 140/140'/140''/140'''/140'''', and the second pinned layer 150/150'/150''/150'''/150'''', respectively. Thus, the structure and function of these components 110''''', 120''''', 130''''', 140''''', and 150''''' are analogous to that described above for FIGS. 2-6 and the components 110/110'/110''/110'''/110'''', 120/120'/120''/120'''/120'''', 130/130'/130''/130'''/130'''', and 140/140'/140''/140'''/140''''. Further, although depicted as a dual magnetic junction 100''''' one of the pinned layers 110''''' or 150''''' and one of the spacer layers 130''''' or 140''''', respectively, may be omitted such that the magnetic junction 100''''' may be a single magnetic junction.

The magnetic junction 100''''' may include the components of one or more of the magnetic junctions 100, 100', 100'', 100''', and 100''''. In addition, the magnetic junction 100''''' includes thermal barriers 170. Thus, the thermal barriers 170 may be included in one or more of the magnetic junctions 100, 100', 100'', 100''', and 100''''. The thermal barriers 170 may prevent or reduce the transfer of heat from the magnetic junction 100'''''. Thus, heat due to the write current passing through the magnetic junction 100''''' may be concentrated in the magnetic junction 100'''''. In some embodiments, the heating may be concentrated in the free layer 130'''''. Thus, the heating of the magnetic junction 100''''' due to the write current and the attendant reduction in the free layer thermal stability may be made more efficient. Thus, the benefits of the magnetic junctions 100, 100', 100'', 100''', 100'''', and/or 100''''' may be achieved.

Figure 8:
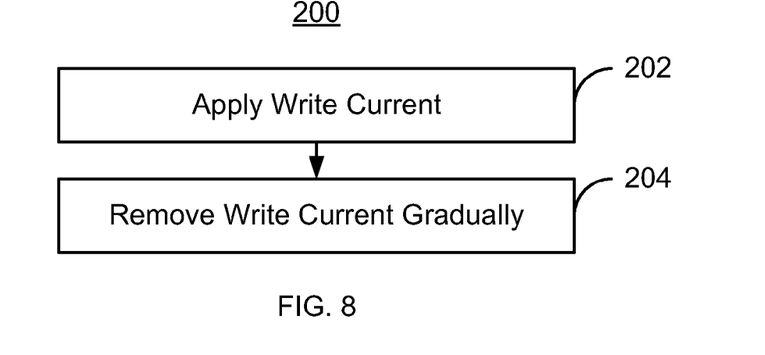
FIG. 8 is a flow chart depicting an exemplary embodiment of a method for programming the magnetic junction.

FIG. 8 depicts one embodiment of a method 200 for writing to a magnetic junction 100, 100', 100'', 100''', 100'''', 100''''', and/or 100''''''. For simplicity, some steps may be omitted, combined, and/or interleaved. The method 200 is described in the context of the magnetic junction 100. However, the method 200 may be used with other magnetic junctions including but not limited to the magnetic junctions 100', 100'', 100''', 100'''', 100''''', and 100''''''

A write current is applied, via step 202. The write current may be applied as a pulse. The duration and rise of the pulse may be configured to heat the free layer 130 in a desired manner. For example, the pulse may be configured to maximize the temperature or to increase the temperature more rapidly.

Once the free layer 130 has switched, the write current is removed gradually, via step 204. In some embodiments the write current is reduced to zero over at least one and not more than ten nanoseconds. As a result, the thermal stability and, therefore, the new state of the free layer 130 are locked in.

Thus, using the method 200, the magnetic junction 100, 100', 100'', 100''', 100'''', and/or 100''''' may be programmed. Thus, the benefits of the magnetic junctions 100, 100', 100'', 100''', 100'''', and/or 100''''' may be achieved.

Figure 9:
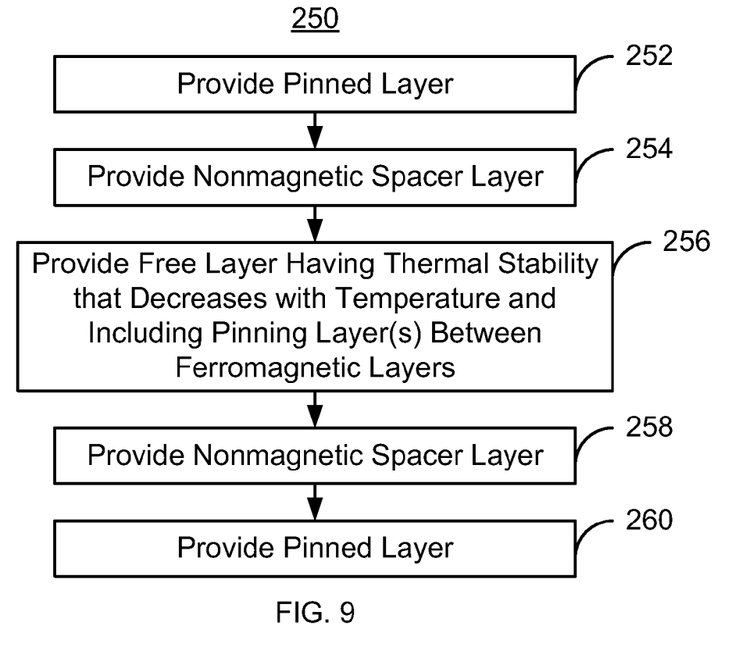
FIG. 9 is a flow chart depicting an exemplary embodiment of a method for providing the magnetic junction.

FIG. 9 depicts one embodiment of a method 250 for providing an exemplary embodiment of a dual magnetic junction. For simplicity, some steps may be omitted, combined, and/or interleaved. The method 250 is described in the context of the magnetic junction 100'. However, the method 250 may be used to provide other magnetic junctions.

The pinned layer 110' is provided, via step 252. In some embodiments, step 252 includes providing a multilayer. In some such embodiments, the pinned layer 110' provided may be a SAF. The nonmagnetic spacer layer 120' is provided, via step 254. In some embodiments, step 254 includes providing a tunneling barrier layer. The free layer 130' is provided via step 256. In some embodiments, the free layer 130' provided may include one or more pinning layers 132 interleaved with ferromagnetic layers 131 and 133. Another nonmagnetic spacer layer 140' is provided, via step 258. The pinned layer 150' is provided, via step 260. Thus, using the method 250, the benefits of one or more of the magnetic junction 100' may be achieved.

Figure 10:
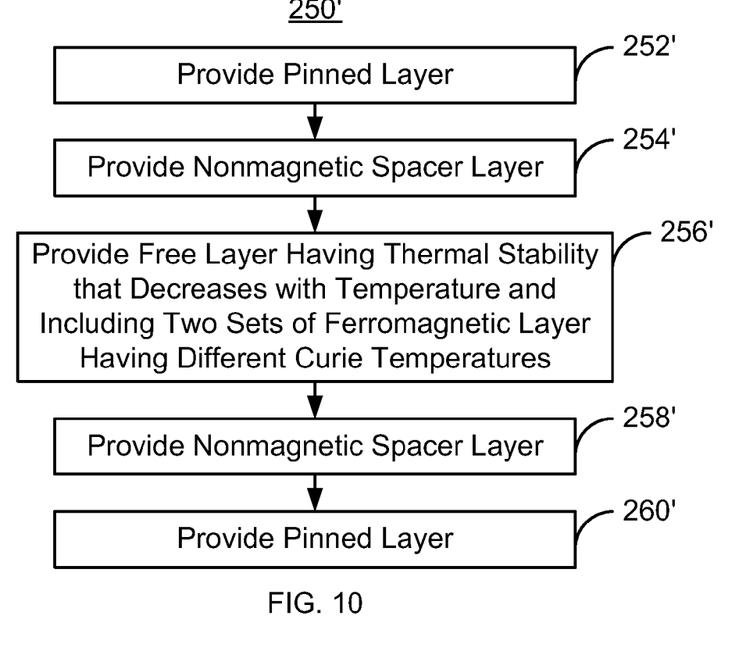
FIG. 10 is a flow chart depicting an exemplary embodiment of a method for providing the magnetic junction.

FIG. 10 depicts one embodiment of a method 250' for providing an exemplary embodiment of a dual magnetic junction. For simplicity, some steps may be omitted, combined, and/or interleaved. The method 250' is described in the context of the magnetic junctions 100''/100'''. However, the method 250' may be used to provide other magnetic junctions.

The pinned layer 110''/110''' is provided, via step 252'. In some embodiments, step 252' includes providing a multilayer. In some such embodiments, the pinned layer 110''/110''' provided may be a SAF. The nonmagnetic spacer layer 120''/120''' is provided, via step 254'. In some embodiments, step 254' includes providing a tunneling barrier layer. The free layer 130''/130''' is provided via step 256'. In some embodiments, the free layer 130''/130''' provided may include interleaved sets of ferromagnetic layers 134/134' and 135/135'. Another nonmagnetic spacer layer 140''/140''' is provided, via step 258. The pinned layer 150'/150'' is provided, via step 260. Thus, using the method 250, the benefits of one or more of the magnetic junctions 100''/100''' may be achieved.

Figure 11:
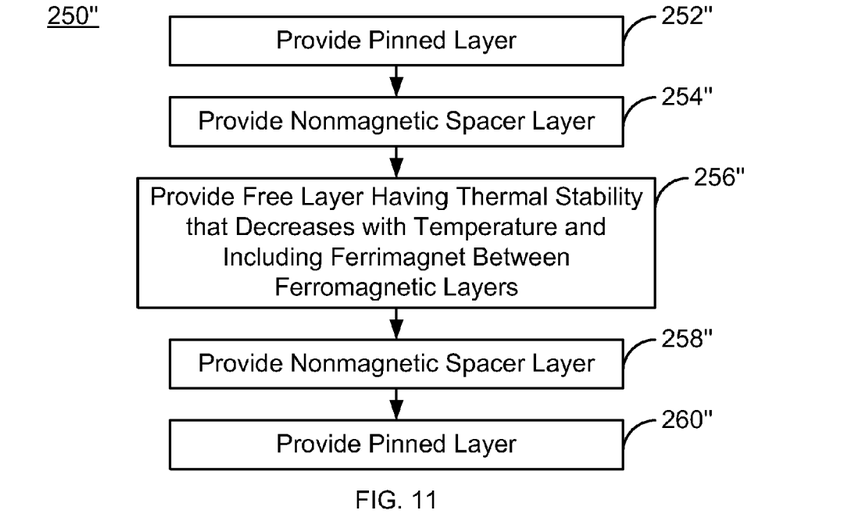
FIG. 11 is a flow chart depicting an exemplary embodiment of a method for providing the magnetic junction.

FIG. 11 depicts one embodiment of a method 250'' for providing an exemplary embodiment of a dual magnetic junction. For simplicity, some steps may be omitted, combined, and/or interleaved. The method 250" is described in the context of the magnetic junctions 100"/100'". However, the method 250" may be used to provide other magnetic junctions.

The pinned layer 110"" is provided, via step 252". In some embodiments, step 252" includes providing a multilayer. In some such embodiments, the pinned layer 110"" provided may be a SAF. The nonmagnetic spacer layer 120"" is provided, via step 254". In some embodiments, step 254" includes providing a tunneling barrier layer. The free layer 130"" is provided via step 256". In some embodiments, the free layer 130"" provided may include ferrimagnetic layer(s) 137 interleaved with ferromagnetic layers 136 and 138. Another nonmagnetic spacer layer 140'" is provided, via step 258. The pinned layer 150'/150" is provided, via step 260. Thus, using the method 250, the benefits of the magnetic junction 100"" may be achieved.

Various magnetic junctions 100, 100', 100", 100'", 100"", and 100'"" have been disclosed. Note that various features of the magnetic junctions 100, 100', 100", 100'", 100"", and 100'"" may be combined. Thus, one or more of the benefits of the magnetic junctions 100, 100', 100", 100'", 100"", and 100'"" may be achieved.

Figure 12:
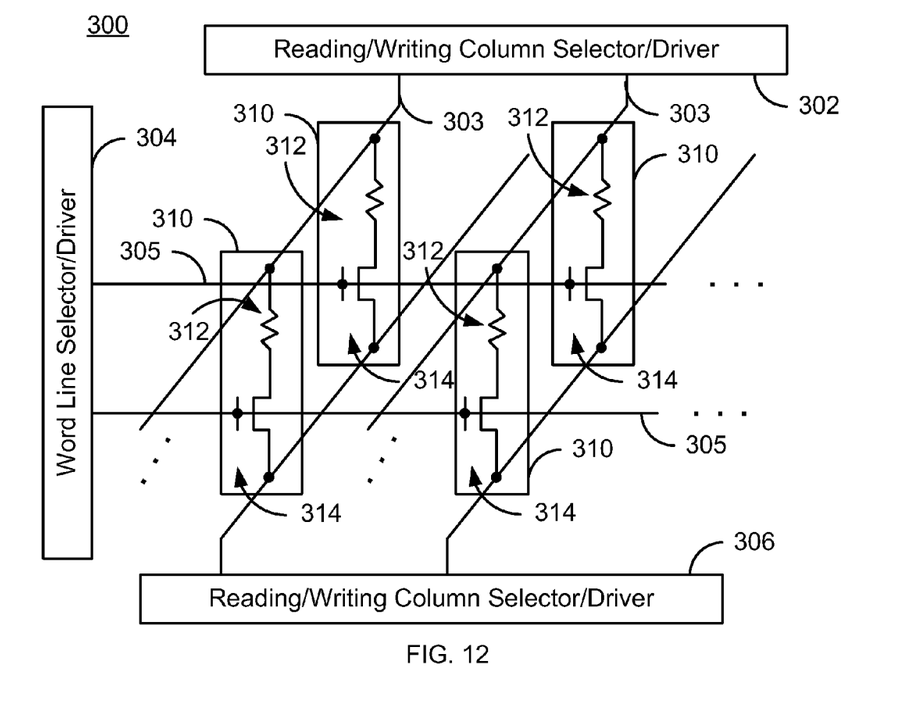
FIG. 12 depicts an exemplary embodiment of a memory utilizing magnetic junctions in the memory element(s) of the storage cell(s).

The magnetic junctions described herein may be used in a magnetic memory. FIG. 12 depicts an exemplary embodiment of one such memory 300. The magnetic memory 300 includes reading/writing column select drivers 302 and 306 as well as word line select driver 304. Note that other and/or different components may be provided. The storage region of the memory 300 includes magnetic storage cells 310. Each magnetic storage cell includes at least one magnetic junction 312 and at least one selection device 314. In some embodiments, the selection device 314 is a transistor. The magnetic junctions 312 may be one of the magnetic junctions 100, 100', 100", 100'", 100"", and 100'"". Although one magnetic junction 312 is shown per cell 310, in other embodiments, another number of magnetic junctions 312 may be provided per cell. As such, the magnetic memory 300 may enjoy the benefits described above, such as higher density.

A method and system for providing a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic junction comprising:
a pinned layer;
a nonmagnetic spacer layer;
a free layer, the nonmagnetic spacer layer residing between the pinned layer and the free layer, the free layer being configured to be switchable using spin transfer torque from a write current passed through the magnetic junction, the free layer being configured to have a first thermal stability coefficient when the write current is not passed through the magnetic junction and have a second thermal stability coefficient due to heating from the write current being passed through the magnetic junction, the second thermal stability coefficient being less than the first thermal stability coefficient, the free layer including a plurality of components having an internal magnetic interaction, the magnetic interaction being altered by the heating due to the write current such that the thermal stability coefficient is reduced from the first thermal stability coefficient to the second thermal stability coefficient; and
wherein the plurality of components of the free layer includes a first plurality of ferromagnetic layers interleaved and exchanged coupled with a second plurality of ferromagnetic layers, the first plurality of layers having at least a first Curie temperature, the second plurality of layers having at least a second Curie temperature greater than the at least the first Curie temperature.

2. The magnetic junction of claim 1 wherein the at least the first Curie temperature is at least one hundred fifty degrees centigrade and not more than five hundred degrees centigrade.

3. The magnetic junction of claim 2 wherein the at least the second Curie temperature is at least six hundred degrees centigrade and not more than one thousand two hundred degrees centigrade.

4. The magnetic junction of claim 1 wherein the second plurality of layers has at least one in-plane magnetization.

5. The magnetic junction of claim 4 wherein the first plurality of layers and the second plurality of layers has a length and a width substantially in plane, the length divided by the width being an aspect ratio of at least two.

6. The magnetic junction of claim 1 wherein the second plurality of layers has at least one perpendicular-to-plane magnetization.

7. The magnetic junction of claim 6 wherein the first plurality of layers has at least one additional perpendicular-to-plane magnetization.

8. The magnetic junction of claim 1 further comprising:
an additional pinned layer; and
an additional spacer layer between the free layer and the additional pinned layer.

9. A magnetic memory comprising:
a plurality of magnetic memory cells, each of the magnetic memory cells including at least one magnetic junction, the at least one magnetic junction including a first pinned layer, a first tunneling barrier layer, a free layer, a second tunneling barrier layer, and a second pinned layer, the free layer configured to have a first thermal stability coefficient when a write current is not passed through the magnetic junction and have a second thermal stability coefficient due to heating from the write current being passed through the at least one magnetic junction, the second thermal stability coefficient being less than the first thermal stability coefficient, the free layer including a plurality of components having an internal magnetic interaction, the magnetic interaction being altered by the heating due to the write current such that the thermal stability coefficient is reduced from the first thermal stability coefficient to the second thermal stability coefficient, the plurality of components including a first plurality of ferromagnetic layers interleaved with a second plurality of ferromagnetic layers, the first plurality of layers having at least a first Curie temperature of at least one hundred fifty and not more than five hundred degrees centigrade, the second plurality of layers having at least a second Curie temperature of at least six hundred and not more than one thousand two hundred degrees centigrade, the free layer being configured to be switchable using spin transfer torque from the write current passed through the magnetic junction, the first tunneling barrier layer being between the first pinned layer and the free layer, the second tunneling barrier layer residing between the second pinned layer and the free layer, the second Curie temperature being greater than the at least the first Curie temperature; and
a plurality of bit lines coupled with the plurality of magnetic memory cells.

10. A method for providing a magnetic junction comprising:
providing a pinned layer;
providing a nonmagnetic spacer layer;
providing a free layer, the nonmagnetic spacer layer residing between the pinned layer and the free layer, the free layer being configured to be switchable using spin transfer torque from a write current passed through the magnetic junction, the free layer being configured have a first thermal stability coefficient when the write current is not passed through the magnetic junction and have a second thermal stability coefficient due to heating from the write current being passed through the magnetic junction, the second thermal stability coefficient being less than the first thermal stability coefficient, the free layer including a plurality of components having an internal magnetic interaction, the magnetic interaction being altered by the heating due to the write current such that the thermal stability coefficient is reduced from the first thermal stability coefficient to the second thermal stability coefficient, wherein the plurality of components of the free layer includes a first plurality of ferromagnetic layers interleaved and exchanged coupled with a second plurality of ferromagnetic layers, the first plurality of layers having at least a first Curie temperature, the second plurality of layers having at least a second Curie temperature greater than the at least the first Curie temperature.

11. The method of claim 10 further comprising:
providing an additional nonmagnetic spacer layer, the free layer being between the nonmagnetic spacer layer and the additional nonmagnetic spacer layer, the second ferromagnetic layer adjoining the additional nonmagnetic spacer layer; and
providing an additional pinned layer, the additional nonmagnetic spacer layer being between the free layer and the additional pinned layer.

12. The method of claim 11 wherein the at least the first Curie temperature is at least one hundred fifty degrees centigrade and not more than five hundred degrees centigrade and wherein the at least the second Curie temperature is at least six hundred degrees centigrade and not more than one thousand two hundred degrees centigrade.

13. The method of claim 12 wherein the second plurality of layers has at least one perpendicular-to-plane magnetization.

14. The method of claim 13 wherein the first plurality of layers has at least one additional perpendicular-to-plane magnetization.

* * * * *